United States Patent
Leas et al.

[11] Patent Number: 6,069,022
[45] Date of Patent: May 30, 2000

[54] OPTICAL FET

[75] Inventors: James Marc Leas, South Burlington, Vt.; Jack Allen Mandelman, Stormville, N.Y.

[73] Assignee: Internationl Business Machines Corporation, Armonk, N.Y.

[21] Appl. No.: 09/092,413

[22] Filed: Jun. 5, 1998

Related U.S. Application Data

[60] Continuation of application No. 08/569,823, Dec. 8, 1995, Pat. No. 5,789,276, which is a division of application No. 08/371,916, Jan. 12, 1995, Pat. No. 5,557,114.

[51] Int. Cl.$^7$ .......................... H01L 21/00; H01L 21/336
[52] U.S. Cl. ................. 438/59; 438/74; 438/301
[58] Field of Search .............. 438/59, 74, 301, 438/592

[56] References Cited

U.S. PATENT DOCUMENTS

| | | | |
|---|---|---|---|
| 3,435,138 | 3/1969 | Borkan | 178/7.1 |
| 3,453,507 | 7/1969 | Archer | 317/235 |
| 3,465,293 | 9/1969 | Weckler | 340/166 |
| 4,144,591 | 3/1979 | Brody | 365/228 |
| 4,354,309 | 10/1982 | Gardiner et al. | 29/571 |
| 4,481,349 | 11/1984 | Marten et al. | 528/120 |
| 4,745,446 | 5/1988 | Cheng et al. | 357/22 |
| 4,771,325 | 9/1988 | Cheng et al. | 357/30 |
| 4,859,965 | 8/1989 | Paolella et al. | 330/285 |
| 4,893,273 | 1/1990 | Usami | 365/185 |
| 4,929,994 | 5/1990 | Matsumoto | 357/30 |
| 4,952,791 | 8/1990 | Hinton et al. | 250/211 J |
| 5,045,680 | 9/1991 | Fan et al. | 250/213 A |
| 5,059,788 | 10/1991 | Tashiro et al. | 250/213 A |
| 5,130,773 | 7/1992 | Tsukada | 357/23.7 |
| 5,144,398 | 9/1992 | Morishita | 357/34 |
| 5,235,195 | 8/1993 | Tran et al. | 257/59 |
| 5,254,480 | 10/1993 | Tran | 437/2 |
| 5,604,157 | 2/1997 | Dai et al. | 437/200 |
| 5,652,156 | 7/1997 | Liao et al. | 437/40 |
| 5,767,004 | 6/1998 | Balasubramanian et al. | 438/301 |
| 5,885,889 | 3/1999 | Aisou | 438/301 |
| 5,985,689 | 11/1999 | Gofuku et al. | 438/59 |
| 6,011,215 | 1/2000 | Glatfelter et al. | 438/74 |

OTHER PUBLICATIONS

MacDonald, M.C. & Everhart, T.E., "An Electron Beam Activated Switch and Associated Memory," Proceedings of the IEEE, vol. 56, No. 2, Feb. 1968, pp. 158–166.

Gosh, A.K., Fishman, C. & Feng, T., "Theory of the Electrical and Photovoltaic Properties of Polycrystalline Silicon," Journal of Applied Physics, vol. 51, Jan. 1980, pp. 446–454.

Kamins, T.I., et al., "A Monolithic Integrated Circuit Fabricated in Laser–Annealed Polysilicon," IEEE Transitions on Electron Devices, vol. ED–27, No. 1, Jan. 1980, pp. 290–293.

Weckler, G.F., "Charge Storage Lights The Way For Solid–State Image Sensors," Electronics, May 1967, pp.75–78.

*Primary Examiner*—Richard T. Elms
*Assistant Examiner*—Michael S. Lebentritt
*Attorney, Agent, or Firm*—Heslin & Rothenberg, P.C.; Wayne F. Reinke, Esq.

[57] ABSTRACT

An optical FET includes one or more light-responsive diodes stacked on the gate. Each diode includes a planar (horizontal) junction. The number of diodes is chosen to achieve a desired gate to source potential difference. An electrical connection connects the diode(s) to the source of the FET.

18 Claims, 3 Drawing Sheets

OPTICAL FET

This application is a continuation of application Ser. No. 08/569,823 filed Dec. 8, 1995, U.S. Pat. No. 5,789,276, which is a divisional application of Ser. No. 08/371,916 filed Jan. 12 1995, U.S. Pat. No. 5,557,114.

BACKGROUND OF THE INVENTION

1. Technical Field

The present invention generally relates to transistors. More particularly, the present invention relates to light-responsive field effect transistors.

2. Background Information

In the past, light-responsive field effect transistors or optical FETs have been limited in usefulness, due to the size thereof and the limited voltage provided thereby, which may be inadequate for some applications. One example of such an optical FET can be found in U.S. Pat. No. 4,841,349 issued to Nakano, and entitled "Semiconductor Photodetector Device With Light Responsive PN Junction Gate." Nakano discloses an optical FET with a gate extension, forming a PN junction lying in a vertical plane. See FIG. 2 of Nakano. Although the gate extension and vertical junction of Nakano may help reduce the amount of light impinging on the channel region, the Nakano gate extension uses up valuable chip real estate and requires more processing than may be necessary. In addition, the voltage produced by a single junction in response to light impinging thereon may be inadequate for some applications.

Thus, a need exists for an optical FET that minimizes the use of real estate and the number of processing steps, while providing a customizable voltage in response to light.

SUMMARY OF THE INVENTION

Briefly, the present invention satisfies the need for an optical FET that minimizes the use of real estate and minimizes the processing thereof, as well as providing customizable voltages by providing a FET with one or more light-responsive diodes vertically adjacent the gate of the FET such that each diode includes a horizontal or planar junction.

In accordance with the above, it is an object of the present invention to provide a light-responsive FET that reduces the use of valuable real estate.

It is another object of the present invention to provide a light-responsive FET where minimal processing steps are added over conventional FETs.

A further object of the present invention is to provide a light-responsive FET having a customizable voltage output in response to light.

The present invention provides, in a first aspect, a light-responsive FET, comprising a gate and a light-responsive diode vertically adjacent the gate, the light-responsive diode including a planar junction. The light-responsive FET may also include a source and an electrical connection between the light-responsive diode and the source. The light-responsive FET may also include at least one other stacked light-responsive diode contiguous with the gate and also including a planar junction. Where the light-responsive FET includes at least two diodes, the light-responsive FET may further comprise an ohmic contact between each of the at least two stacked light-responsive diodes. The ohmic contact may comprise a layer of titanium nitride.

The present invention provides, in a second aspect, a method of forming a light-responsive FET, comprising steps of: (a) providing a semiconductor substrate; (b) depositing a dielectric layer on the semiconductor substrate; (c) forming a gate on the dielectric layer; (d) forming a light-responsive diode vertically adjacent the gate which includes a planar PN junction; and (e) forming a source and drain in the semiconductor substrate. Steps (c) and (d) together may comprise steps of: depositing a first layer of semiconductor material on the dielectric layer; doping a first portion of the first layer of semiconductor material adjacent the dielectric layer with a first concentration of a first dopant type; doping a second portion of the first layer adjacent the first portion with a second concentration of the first dopant type; depositing a second layer of semiconductor material on the first layer; and doping the second layer with a second dopant type. Alternatively, steps (c) and (d) together may comprise steps of: forming a plurality of layers of semiconductor material on the dielectric layer; doping at least one of the plurality of layers of semiconductor material; and defining the gate and the light-responsive diode. The method may further comprise steps of: forming an ohmic contact on the light-responsive diode; and forming another light-responsive diode on the ohmic contact.

These, and other objects, features and advantages of this invention will become apparent from the following detailed description of the various aspects of the invention taken in conjunction with the accompanying drawings.

BEST MODE FOR CARRYING OUT THE INVENTION

Figure 1:
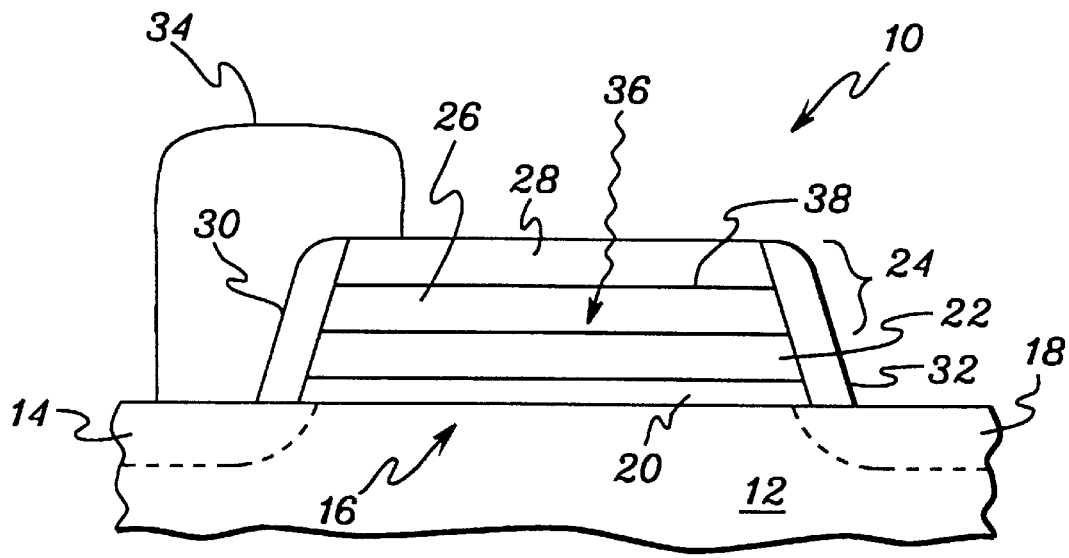
FIG. 1 depicts a light-responsive FET with a single diode contiguous with the gate according to the present invention.

FIG. 1 depicts a light-responsive FET 10 according to the present invention. Light-responsive FET 10 is formed on semiconductor substrate 12, and comprises source 14, channel 16, drain 18, gate dielectric layer 20, gate 22, diode 24 including layers 26 and 28, spacers 30 and 32, conductive connection 34 and planar junction 38. The operation of light responsive FET 10 will now be described in general and in detail in the context of an exemplary embodiment.

In general, light 36 from an optical source (not shown) impinges on light-responsive diode 24, causing a voltage to be developed. As used herein, the term "light" is intended to include any electromagnetic radiation that produces electron-hole pairs in a semiconductor. Other possible electron-hole pair generators included in the term "light" are electrons, alpha particles, other ions and atomic particles. Through conductive connection 34, the developed voltage causes a gate to source potential difference acting to turn on or turn off light responsive FET 10, depending on whether the potential difference is positive or negative. When light 36 is removed, the voltage developed by light-responsive diode 24 in response thereto dissipates, leading to a turn-off or turn-on of light-responsive FET 10.

Assume now that semiconductor substrate 12 comprises silicon, source 14 and drain 18 comprise N type silicon, channel 16 comprises P type silicon, gate 22 and layer 26 comprise P type silicon, and layer 28 comprises N type silicon. Preferably, source 14, drain 18 and layer 28 all comprise N+ type silicon, gate 22 comprises P+ type silicon and layer 26 comprises P− type silicon. Gate 22 may be comprised of, for example, polycrystalline silicon or amorphous silicon. Spacers 30 and 32 may be, for example, oxide or nitride spacers. Layers 26 and 28 within light-responsive diode 24 may comprise, for example, amorphous, polycrystalline or single crystal silicon. Alternatively, layers 26 and 28 may comprise other semiconductor materials, such as germanium, gallium arsenide, indium phosphide, silicon carbide, etc., known in the photovoltaic literature. One of layers 26 and 28 may also comprise a metal or metal silicide layer to form a Schottky diode. Conductive connection 34 may be, for example, a metal or doped polysilicon film, and is depicted as a simple conductive connection 34 in FIG. 1 for ease of illustration only. Physically tieing the diode to the source is only one possible configuration. One skilled in the art will understand that the two need not be tied together for operation of the device in an actual circuit.

Upon light 36 impinging on planar junction 38, which, in the present example is a PN junction, electron-hole pairs are created, with electrons drifting and diffusing to layer 26 and the holes to layer 28. As a result of the field created by the electron-hole space charge separation, a photovoltage is developed across light-responsive diode 24. Doping gate 22 heavily relative to layer 26 causes a reflection of minority carriers back toward PN junction 38, slightly increasing the efficiency of light-responsive diode 24 as compared to a uniform doping for both layer 26 and gate 22. It will be understood that although a simple diode 24 has been described herein, other types of diodes may be used in the present invention, such as, for example, a Schottky diode or a PIN diode (lightly doped intrinsic layer serving as a dielectric barrier between P and N regions). It will also be understood that although FIG. 1 depicts an NFET, the invention is also applicable to PFETs. The diode on the gate can then be reversed in polarity by reversing the P and N layers to provide the correct gate to source voltage polarity.

Schottky diodes can be formed either in polycrystalline or amorphous silicon. The metal for the Schottky diode may be located at the surface of the semiconductor or between the gate polysilicon and the diode silicon. The use of a Schottky simplifies the process of forming an amorphous silicon diode, since the metal can be deposited as a blanket layer and only a single layer of amorphous or polycrystalline silicon need be deposited.

Figure 2:
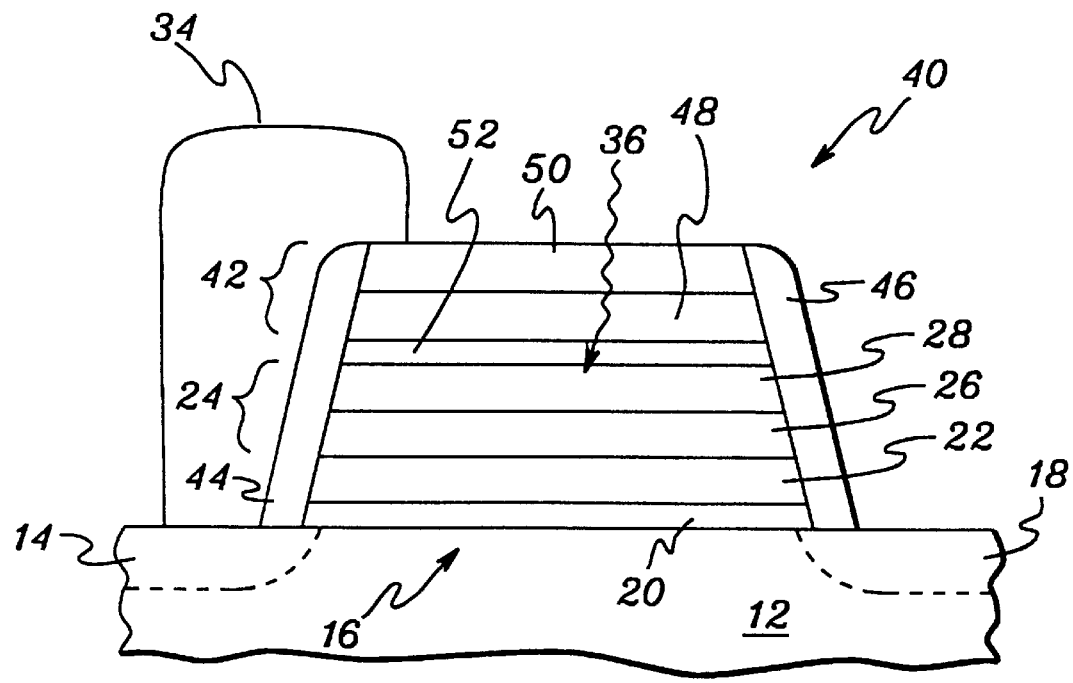
FIG. 2 depicts a light-responsive FET having two stacked diodes contiguous with the gate in accordance with the present invention.

FIG. 2 depicts a light-responsive FET 40 in accordance with the present invention. Light-responsive FET 40 is similar to FET 10 in FIG. 1, except that a second light-responsive diode 42 is stacked on top of diode 24, and an ohmic contact 52 is introduced between diodes 24 and 42. Each diode layer is thinner than in FIG. 1, so that the light will be evenly absorbed in the two diodes. Light-responsive diode 42 comprises layers 48 and 50. An exemplary embodiment of the light-responsive FET 40 of FIG. 2 will now be provided.

Assume that gate 22 and layers 26 and 28 are doped as described above with respect to the exemplary embodiment of FET 10 of FIG. 1. Layers 48 and 50, like layers 26 and 28 comprise silicon, and may be, for example, amorphous, polycrystalline, single crystal silicon or other semiconductor materials listed above. In addition, assume layer 48 is doped with a P− type dopant, and layer 50 is doped with a N+ type dopant. As a consequence of layer 28 comprising an N+ type dopant and layer 48 comprising a P− type dopant, ohmic contact 52 is added to inhibit the formation of a space charge region associated with the junction between layers 28 and 48. Ohmic contact 52 may be, for example, a layer of titanium nitride, or a silicide, such as titanium, cobalt, molybdenum or tungsten. Ohmic contact 52 could also be, as a further example, a thin layer of metal. To improve the device contact, a P+ type layer may be formed under layer 48. When a positive gate to source voltage is applied, holes in the P type channel 16 migrate away and electrons are attracted thereto, so that an N type inversion region is created connecting the N type source 14 and drain 18. As described, light-responsive diodes 24 and 42 provide an additive voltage which, through conductive connection 34, provides a greater gate to source potential difference (the gate is positive with respect to the source) than the light-responsive FET 10 of FIG. 1. A greater potential difference provides a harder turn-on of FET 40 and more current for applications requiring same.

Although only two diodes have been shown stacked in the light-responsive FET 40 of FIG. 2, it will be understood that any number of diodes could be stacked to achieve the voltage desired for a particular application. However, as the number of stacked diodes increases, it may be necessary to adjust the thicknesses of the layers within the diodes, so that light 36 is able to penetrate to all of the layers of all the diodes.

Although the layers of diodes 24 and 42 of light-responsive FET 40 (and those of diode 24 in FIG. 1) have been described as comprising amorphous, polycrystalline or single crystal silicon, amorphous silicon is preferred over crystalline silicon. This preference stems from the fact that crystalline silicon has a much lower absorption coefficient than hydrogenated amorphous silicon, and therefore a much thicker layer would be needed. As an example, one micron of hydrogenated amorphous silicon is able to absorb most of the photons with an energy greater than the equivalent optical band gap of about 1.55 eV. This absorption is equivalent to that of about 100 microns of crystalline silicon. Thus, to ensure that a maximum amount of light 36 is absorbed in the diode layers, and as little light as possible impinges on channel 16, the use of crystalline silicon for the diode is not preferred. The use of a metal layer in a Schottky diode may further ensure that, due to reflectance, very little light reaches channel 16. In addition, to further ensure absorption of light above channel 16, amorphous silicon may be used for gate 22.

In addition, the components of light 36 may be tailored to provide the depth of penetration desired. For example, a composite light of particular wavelengths may be appropriate, since the absorption coefficient decreases with wavelength. As an example of tailoring the thicknesses of the diode layers, and referring to the light-responsive FET 40 of FIG. 2, layers 48 and 50 may be thinner than the corresponding layers 26 and 28, so that half of the light 36 is absorbed in diode 42 and half in diode 24.

It will be understood that the diodes (and FET in general) of the present invention could be formed of another type of semiconductor material other than silicon, such as gallium arsenide or germanium. However, if a light-responsive FET according to the present invention is being made part of a silicon-based semiconductor chip, it may be most efficient to use silicon to minimize the number of process steps. For example, in FIG. 1, the use of N+ type doped silicon in layer 28, source 14 and drain 18 allow for the doping of layer 28 at the same time that source 14 and drain 18 are implanted. Thus, the composition of the diode or diodes in a light-responsive FET according to the present invention may facilitate combining of process steps, thereby reducing cost.

A light-responsive FET according to the present invention is useful in many applications, such as any application requiring the detection of an optical signal. As another example, a light-responsive FET according to the present invention is useful for imaging.

In a second aspect of the present invention, a method of forming a light-responsive FET according to the first aspect of the present invention is provided. The method will be described with respect to light-responsive FET 40 of FIG. 2. Initially, gate dielectric layer 20 is thermally grown or deposited on semiconductor substrate 12 using conventional techniques. Gate 22 is first deposited as a blanket layer having a heavy P+ type doping, then diode layer 26 is deposited as a blanket layer having a P− type doping. Layer 28 is then deposited as a blanket layer having an N+ type doping to complete the layer depositions for the first diode. The blanket layer depositions may include, for example, in-situ CVD deposition, a technique well known in the art, in which doping types and doping levels are adjusted during a silicon deposition. Thus, the different dopings required for gate 22 and diode layers 26 and 28 can be achieved in an in-situ deposition. Other techniques, such as diffusion or ion implantation may be used. However, ion implantation is not preferred, since a high-temperature anneal would be necessary, which would transform amorphous silicon to polycrystalline silicon, which absorbs less light. An ohmic contact 52 is then formed above layer 28 using conventional techniques. Ohmic contact 52 may comprise, for example, a layer of titanium nitride, or a thin layer of metal, either of which forms an ohmic contact to the N+ layer below and a later-deposited P+ layer above. Of course, this metal layer must be quite thin, on the order of 50–200 Angstroms, so that light is able to penetrate to the diode below. Alternatively, a metal silicide may be formed after all silicon layers have been deposited by annealing at about 450° C.

After forming ohmic contact 52, layer 48 may be formed and doped in a manner similar to that described previously. After forming layer 48, a layer of silicon may be deposited that will become doped layer 50. Finally, a cap dielectric is deposited. The cap may be formed of a material having an index of refraction suitable for an antireflective coating between silicon and other materials that may later be deposited thereon. Such materials may include titanium oxide and tantalum pentoxide. It is preferable to do the masking one time after all layers are deposited. Conventional masking and directional etching techniques are then used to define the gate and the planar diodes stacked on the gate. Sidewall spacers 44 and 46 are then formed, and source 14 and drain 18 are implanted at the same time that layer 50 is doped. After source 14 and drain 18 are implanted, annealing is performed to activate the dopant therein. Layer 50 may also be doped during the in-situ deposition and then protected from the source/drain implant by the cap dielectric. After formation of light-responsive FET 40, conductive connection 34 or connections to other circuits may be created, for example, by creating a metal contact.

Figure 3A:
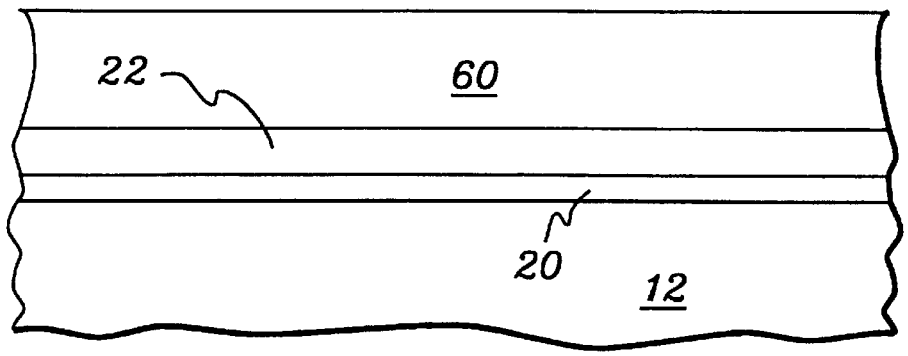
FIGS. 3a–3f depict a light-responsive FET according to the present invention in various stages of formation.
Figure 3B:
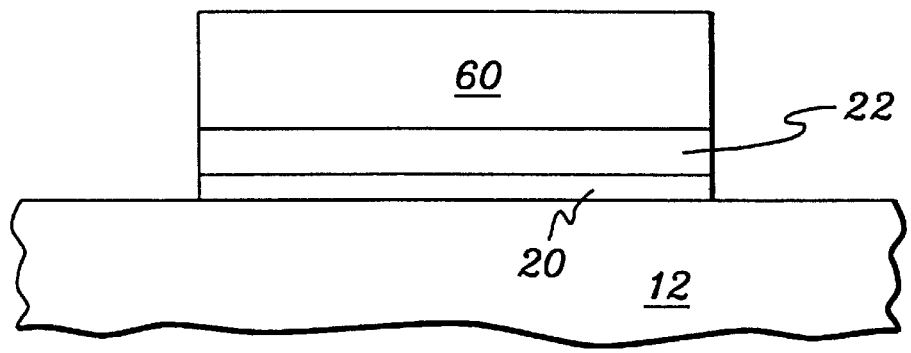
Figure 3C:
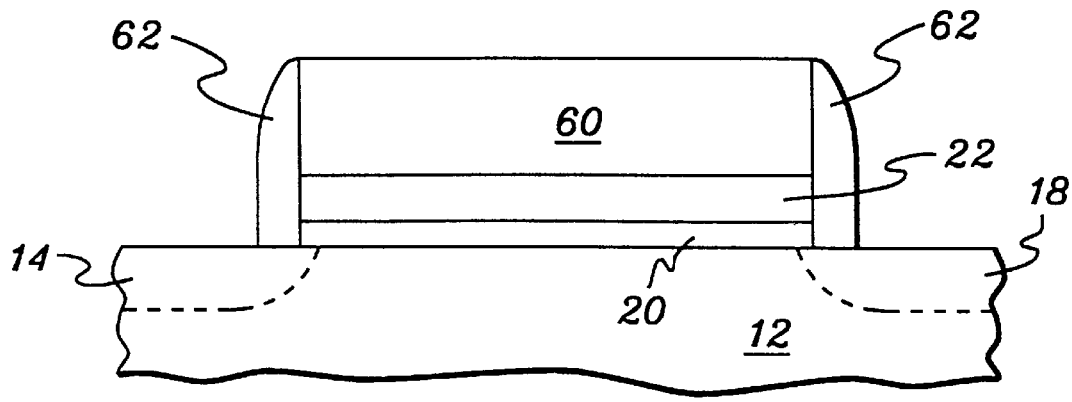
Figure 3D:
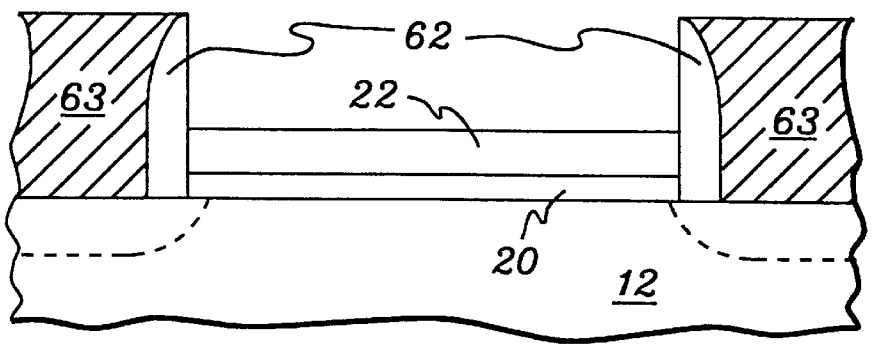
Figure 3E:
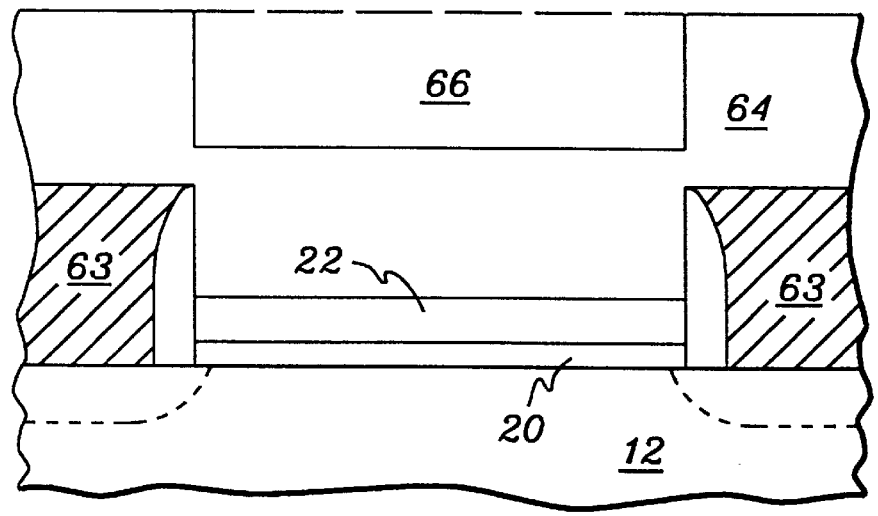
Figure 3F:
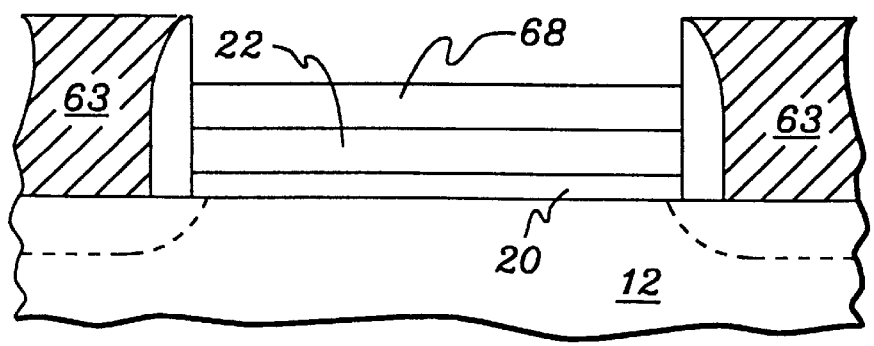

Alternatively, the source and drain implant and anneal may be performed before the deposition of layers 26, 28, 48 and 50, as well as before the formation of ohmic contact 52. This may be accomplished by capping the blanket layer that will be gate 22 with, for example, a blanket thick oxide cap 60 (see FIG. 3*a*). After capping, conventional masking and directional etching techniques are used to define the gate and cap thereon (see FIG. 3*b*). Nitride spacers 62 are then formed and the source and drain implanted and annealed (see FIG. 3*c*). After implanting and annealing the source and drain, the cap is removed (see FIG. 3*d*) and layers for diodes 24 and 42 are formed using CVD deposition and diffusion or a sequence of in-situ depositions and recess etches as described below. Mandrel 63 is first deposited and planarized (stopping on cap oxide 60) to fill space between devices. Then, the first semiconductor layer 64 is deposited, filling the region left vacant by the removed cap (see FIG. 3*e*). This layer is then planarized by depositing a fill layer 66, such as resist, and then recess etching to leave a planar layer 68 within that region (see FIG. 3*f*). Planar layer 68 will become layer 26 of light-responsive FET 40 after doping. The deposition, planarization, and recess etch steps are repeated for each layer, including ohmic contact layer 52. When all layers are formed, mandrel 63 may be removed, or source/drain contacts may be made through mandrel 63. In this alternate process, amorphous silicon used in the formation of the diodes remains amorphous, since it is not exposed to high temperatures from the source/drain anneal process.

Alternatively, one can simply deposit the layers for the diodes sequentially, omitting the planarization and recess etch steps described above. In that case, a portion of each layer will intersect the surface of the diode stack thereby formed, and the planar junction or junctions will actually follow the curvature of the layers. Appropriate masking can permit a contact to the top layer to avoid shorting adjacent layers.

To assure a good ohmic contact when using the in-situ deposition technique, heavily doped regions can be provided in contact with both surfaces of the ohmic contact layer. In the process described above, for example, an additional layer, formed of P+ type material, may be provided directly over the ohmic contact layer. The P− and N+ layers for the top diode are then deposited. The structure would then be P+, P−, N+, TiN, P+, P−, N+. The structure above the ohmic contact layer would be the same as that below.

FETs having either a high or a low threshold voltage ($V_T$) can be formed using the process of the present invention. An N-type channel device with the structure described above, namely a gate having a P+ type doping, will have a high $V_T$. In this case, the desired structure for the gate of a FET in which the gate has a single diode thereon is P+, P−, N+. If an N+ type doping is provided in the gate, then the $V_T$ of the FET will be about one-half volt lower, and the device will be easier to turn on with light. In this case, the desired structure for the gate of a FET in which the gate has a single diode is N+, TiN, P−, N+. Of course, the $V_T$ can be further tailored by adjusting the channel doping.

While several aspects of the present invention have been described and depicted herein, alternative aspects may be effected by those skilled in the art to accomplish the same objectives. For example, the FET could be either an enhancement or depletion mode device. In the latter case, the diode on the gate is arranged so that the photovoltage turns off the transistor. Accordingly, it is intended by the appended claims to cover all such alternative aspects as fall within the true spirit and scope of the invention.

What is claimed is:

1. A method of forming a light-responsive FET, comprising steps of:
   (a) providing a semiconductor substrate;
   (b) depositing a dielectric layer on said semiconductor substrate;
   (c) forming a gate on said dielectric layer;
   (d) forming a light-responsive diode vertically adjacent said gate, said light-responsive diode comprising a planar junction, wherein said light-responsive diode when formed covers an area no larger than said gate; and
   (e) forming a source and a drain in said semiconductor substrate.

2. The method of claim 1 wherein said step (e) precedes said step (d).

3. The method of claim 1 wherein said steps (c) and (d) together comprise steps of:
   forming a plurality of layers of semiconductor material on said dielectric layer;
   doping at least one of said plurality of layers of semiconductor materials; and
   defining said gate and said light-responsive diode.

4. The method of claim 1 further comprising a step of depositing a metal layer on said dielectric layer, and wherein said step (d) comprises forming said light-responsive diode on said metal layer.

5. The method of claim 1 further comprising a step of providing a mandrel layer on said substrate to self-align said light-responsive diode to said gate and said source and drain.

6. The method of claim 1, wherein said steps (c) and (d) are performed in a single masking step.

7. A method of forming a light-responsive FET, comprising steps of:
   (a) providing a semiconductor;
   (b) forming a transistor on said semiconductor, said transistor comprising a switching member; and
   (c) forming a light-responsive diode contacting and covering an area no larger than said switching member.

8. The method of claim 7 wherein said step (b) comprises forming a field effect transistor.

9. The method of claim 8 wherein said switching member comprises a gate.

10. The method of claim 9 further comprising a step of forming a source diffusion region and a drain diffusion region self-aligned to said gate.

11. The method of claim 10 wherein said step (c) comprises forming said light-responsive diode with a junction vertically adjacent said gate.

12. The method of claim 10 wherein said step (a) comprises providing a semiconductor substrate.

13. The method of claim 7, wherein said switching member and said light responsive diode are formed in a single masking step.

14. A method of forming a light-responsive FET, comprising steps of:
   (a) providing a semiconductor having a surface;
   (b) forming a dielectric layer on said surface;
   (c) forming a gate on said dielectric layer;
   (d) forming a source and a drain in said semiconductor self-aligned to said gate; and
   (e) forming a light-responsive diode contacting and covering an area no larger than said gate.

15. The method of claim 14 wherein said step (e) comprises forming said light-responsive diode with a junction vertically adjacent said gate.

16. The method of claim 14 wherein said step (e) comprises forming said light-responsive diode self-aligned with said gate and with said source and said drain.

17. The method of claim 14 wherein said step (a) comprises providing a semiconductor substrate.

18. The method of claim 14, wherein said steps (c) and (e) are performed in a single masking step.

* * * * *

UNITED STATES PATENT AND TRADEMARK OFFICE
CERTIFICATE OF CORRECTION

PATENT NO. : 6,069,022
DATED : May 30, 2000
INVENTOR(S) : James Marc Leas, Jack Allan Mandelman It is certified that error appears in the above-identified patent and that said Letters Patent is hereby corrected as shown below:

On the title page item [75], should read -- James Marc Leas, Jack Allan Mandelman On the title page item [73], should read -- International Business Machines Corporation --

Signed and Sealed this

Nineteenth Day of December, 2000

Attest:

Q. TODD DICKINSON

*Attesting Officer*   *Commissioner of Patents and Trademarks*

UNITED STATES PATENT AND TRADEMARK OFFICE
CERTIFICATE OF CORRECTION

PATENT NO. : 6,069,022
DATED : May 30, 2000
INVENTOR(S) : Leas et al.

It is certified that error appears in the above-identified patent and that said Letters Patent are hereby corrected as shown below:

ON THE TITLE PAGE:

Item No. [73] Assignee: Delete "Internationl" and replace with --International--.

Signed and Sealed this

Twenty-fourth Day of April, 2001

Attest:

NICHOLAS P. GODICI

Attesting Officer     Acting Director of the United States Patent and Trademark Office